(12) United States Patent
Yoshizawa et al.

(10) Patent No.: US 7,940,104 B2
(45) Date of Patent: May 10, 2011

(54) SIGNAL GENERATING APPARATUS, FILTER APPARATUS, SIGNAL GENERATING METHOD AND FILTERING METHOD

(75) Inventors: Atsushi Yoshizawa, Kanagawa (JP); Sachio Iida, Chiba (JP)

(73) Assignee: Sony Corporation, Tokyo (JP)

( * ) Notice: Subject to any disclaimer, the term of this patent is extended or adjusted under 35 U.S.C. 154(b) by 9 days.

(21) Appl. No.: 12/171,754

(22) Filed: Jul. 11, 2008

(65) Prior Publication Data

US 2009/0015306 A1  Jan. 15, 2009

(30) Foreign Application Priority Data

Jul. 12, 2007  (JP) ................................. P2007-183484

(51) Int. Cl.
*G06F 1/04* (2006.01)
(52) U.S. Cl. .................... 327/291; 327/298; 327/165
(58) Field of Classification Search .......... 327/113–121, 327/291, 293–299, 165, 178
See application file for complete search history.

(56) References Cited

U.S. PATENT DOCUMENTS

| | | | | |
|---|---|---|---|---|
| 5,734,283 | A  * | 3/1998 | Hedberg ........................ | 327/277 |
| 6,388,492 | B2 * | 5/2002 | Miura et al. .................. | 327/291 |
| 6,990,165 | B2 * | 1/2006 | Boerstler et al. ............. | 375/376 |
| 7,276,945 | B2 * | 10/2007 | Choi ............................. | 327/156 |
| 7,414,443 | B2 * | 8/2008 | Jacobsson et al. ............ | 327/116 |
| 2005/0104673 | A1 * | 5/2005 | Okamura ....................... | 331/57 |

OTHER PUBLICATIONS

R. Bagheri et al., "An 800 MHz to 5GHz Software-Defined Radio Receiver in 90nm CMOS", 2006 IEEE, International Solid-State Circuits Conference.
Lizhong Sun et al., A 1.25-GHz 0.35-μm Monolithic CMOS PLL Based on a Multiphase Ring Oscillator, 2001 IEEE Journal of Solid-State Circuits, vol. 36, No. 6.

* cited by examiner

*Primary Examiner* — An T Luu
(74) *Attorney, Agent, or Firm* — Finnegan, Henderson, Farabow, Garrett & Dunner, L.L.P.

(57) ABSTRACT

There is provided a signal generating apparatus including: a multiphase oscillating portion for generating a number of base signals having the same frequency and a predetermined phase difference of which the signal level transitions between a first level and a second level, and where periods during which the signal level of any given base signal is at the first level and the signal level of the next base signal having the predetermined phase delay relative to the given base signal is at the first level overlap; and a transition time point changing portion for generating a pulse signal by changing the time point when each base signal transitions from the first level to the second level to a time point before the next base signal transitions from the second level to the first level.

9 Claims, 11 Drawing Sheets ously generated by the ring oscillator having a predetermined phase difference, to be generated.

SIGNAL GENERATING APPARATUS, FILTER APPARATUS, SIGNAL GENERATING METHOD AND FILTERING METHOD

CROSS REFERENCES TO RELATED APPLICATIONS

The present invention contains subject matter related to Japanese Patent Application JP 2007-183484 filed in the Japan Patent Office on Jul. 12, 2007, the entire contents of which being incorporated herein by reference.

BACKGROUND OF THE INVENTION

1. Field of the Invention

The present invention relates to a signal generating apparatus, a filter apparatus, a signal generating method and a filtering method.

2. Description of the Related Art

In wireless communications, various types of data, such as animation image data, still image data and music data, is transmitted and received. In recent years, the amount of the various types of data described above has tended to increase as the precision has increased, and therefore, a higher communication speed (transmitting and receiving performance) has become required for wireless communication. In general, a wide range of frequency bands is required in order to achieve high-speed communication. For example, it is necessary for wireless communication apparatuses to use a frequency band of several hundreds of MHz to several GHz in order to achieve a communication speed of several hundreds of Mbps to several Gbps.

In addition, it is necessary for wireless communication apparatuses to carry out appropriate signal processes, such as amplification, frequency conversion, frequency selection and gain adjustment on wideband signals having such a wide range of frequency bands using a CMOS process. Meanwhile, together with the miniaturization of CMOS's, there are restrictions in terms of the design, such as inconsistency in the properties between elements and reduction in the power supply voltage, and therefore, it is becoming more difficult to implement high-performance circuits for handling a wide-range signal. In particular, high element precision is generally required in filter circuits for selecting a frequency, and therefore, designing methods based on a continuous time analog circuit in related art could arrive at a bottleneck in the design of wireless communication apparatuses.

In view of this situation, a charge domain filter circuit of which the frequency properties are reconfigurable has been proposed as a filter circuit (see 2006 IEEE International Solid-State Circuits Conference 26.6 "An 800 MHz to 5 GHz Software-Defined Radio Receiver in 90 nm CMOS"). Charge domain filter circuits are provided with a number of capacitors and a number of switches for allowing each capacitor and an input terminal to be electrically connected on the basis of a control signal so that different capacitors sample an input signal in sequence.

Accordingly, it is necessary for control signals supplied to the respective switches not to have on periods (signal level at a first level) overlap. These control signals can be generated by driving a number of shift registers, for example.

In addition, IEEE Journal of Solid-State Circuits, Vol. 36, No. 6, June 2001 "A 1.25 GHz 0.35 m Monolithic CMOS PLL Based on a Multiphase Ring Oscillator" describes a ring oscillator which allows a number of multiphase clock signals, each of which has a predetermined phase difference, to be generated.

SUMMARY OF THE INVENTION

As described above, however, when a number of shift registers are driven in order to generate a control signal to be supplied to a charge domain filter circuit, the power consumption increases as the frequency being handled increases. In addition, multiphase clock signals generated by the ring oscillator have overlapping on periods, and therefore, can be hardly used as a control signal and supplied to the charge domain filter circuit.

Thus, the present invention is provided in view of the above described issue, and it is desirable to provide a novel and improved signal generating apparatus, filter apparatus, signal generating method and filtering method which make it possible to generate a number of pulse signals where periods when the signal level is at a first level do not overlap while keeping the power consumption low.

According to an embodiment of the present invention, there is provided a signal generating apparatus having: a multiphase oscillating portion for generating a number of base signals having the same frequency and a predetermined phase difference, which are a number of base signals where periods during which (1) any given base signal and (2) the next base signal having the predetermined phase delay relative to the given base signal are both kept at a first level overlap; and a transition time point changing portion for generating a pulse signal by changing the time point when each of the base signals transition from the first level to the second level to a time point before the next base signal transitions from the second level to the first level.

In this configuration, the multiphase oscillation portion generates a number of base signals and the transition time point changing portion changes the time point when each of the base signals transition from the first level to the second level to a time point before the next base signal having the predetermined phase delay relative to the base signal transitions from the second level to the first level. That is to say, the transition time point changing portion can generate a number of pulse signals where periods during which the signal levels are kept at the first level do not overlap on the basis of the base signals generated by the multiphase oscillating portion.

The transition time point changing portion may be provided with a logic unit for generating one pulse signal by operating a logical product of a first base signal generated by the multiphase signal generating portion and an inverted signal of the base signal having the predetermined phase difference relative to the first base signal. In this configuration, a number of pulse signals where periods during which the signal level is at the first level do not overlap can be generated without operating a number of shift registers, and therefore, the power consumption can be kept low.

The transition time point changing portion may be provided with a delaying portion for generating a signal by inverting the signal level of a first base signal generated by the multiphase signal generating portion and delaying the phase by the predetermined phase difference or less, and a logic unit for generating one pulse signal by operating a logical product of the first base signal and a signal generated by the delaying portion. In this configuration, the logic unit generates a pulse signal of which the signal level is at a first level during the period of time which corresponds to the phase delayed by the delaying portion. Accordingly, the delaying portion generates a signal which is delayed by a phase which is less than the predetermined phase difference, for example, and thus, intervals can be provided between the periods during which the respective signal levels are at the first level.

The multiphase oscillating portion may be a ring oscillator which includes a number of delaying elements for inverting the signal level of inputted signals and outputting a signal which is delayed by the predetermined phase, and the number of base signals may be signals outputted from the number of delaying elements.

According to an embodiment of the present invention, there is provided a filter apparatus where input signals are sampled by different first capacitors in sequence, and at least a portion of the charge stored in the first capacitors when sampled is outputted having: a multiphase oscillating portion for generating a number of base signals having the same frequency and a predetermined phase difference, where periods during which (1) any given base signal and (2) the next base signal having the phase delay relative to the given base signal are both kept at a first level overlap; a transition time point changing portion for generating a pulse signal by changing the time point when each of the base signals transition from the first level to a second level to the time point when or before the next base signal transitions from the second level to the first level; and a switching portion for allowing each of the first capacitors to sample the input signal in sequence on the basis of the number of pulse signals.

In this configuration, the multiphase oscillating portion generates a number of base signals and the transition time point changing portion changes the time point when each of the base signals transition from the first level to the second level to a time point when or before the base signal having the predetermined phase delay relative to the base signal transitions from the second level to the first level. That is to say, the transition time point changing portion can generate a number of pulse signals where the periods during which the signal levels are at the first level do not overlap on the basis of the base signals generated by the multiphase oscillation portion. In addition, the switching portion allows the respective first capacitors to sample input signals in sequence on the basis of the number of pulse signals generated by the transition time point changing portion. Thus, it is not necessary for the filter apparatus to operate a great number of shift registers in order to generate the pulse signals, and therefore, the power consumption can be kept low.

The transition time point changing portion may be provided with a logic unit for generating one pulse signal by operating a logical product of a first base signal generated by the multiphase signal generating portion and an inverted signal of the basic signal having the predetermined phase difference relative to the first base signal. In this configuration, a number of pulse signals where periods when the signal levels are at the first level do not overlap can be generated without operating a great number of shift registers, and therefore, the power consumption can be kept low.

The transition time point changing portion may be provided with a delaying portion for generating a signal by inverting the signal level of a first base signal generated by the multiphase signal generating portion and delaying the phase by the predetermined phase difference or less, and a logic unit for generating one pulse signal by operating a logical product of the first base signal and a signal generated by the delaying portion. In this configuration, the logic unit generates a pulse signal of which the signal level is at the first level during the period of time which corresponds to the phase delayed by the delaying portion. Accordingly, the delaying portion generates a signal which is delayed by a phase which is shorter than the predetermined difference, for example, and thus, intervals can be provided between the periods when the respective signal levels are at the first level.

The first capacitors may be provided with a control terminal into which a pulse signal for lowering the capacitance of the first capacitors is inputted.

According to another embodiment of the present invention, there is provided a signal generating method including the steps of: generating a number of base signals having the same frequency and a predetermined phase difference where periods during which (1) any given base signal and (2) the next base signal having the predetermined phase delay relative to the given base signal are both kept at a first level overlap; and generating a pulse signal by changing the time point when each of the base signals transition from the first level to a second level to a time point before the next base signal transitions from the second level to the first level.

According to another embodiment of the present invention, there is provided a filtering method which is implemented in a filter apparatus where input signals are sampled by different first capacitors in sequence and at least a portion of the charge stored in the first capacitors when sampled is outputted, including the steps of: generating a number of base signals having the same frequency and a predetermined phase difference where periods during which (1) any given base signal and (2) the next base signal having the predetermined phase delay relative to the given base signal are both kept at a first level overlap; generating a pulse signal by changing the time point when each of the base signals transition from the first level to a second level to a time point before the next base signal transitions from the second level to the first level; and making each of the first capacitors sample input signals in sequence on the basis of the pulse signals.

According to the embodiments of the present invention described above, a number of pulse signals where periods when the signal levels are at the first level do not overlap can be generated while keeping the power consumption low.

DETAILED DESCRIPTION OF THE PREFERRED EMBODIMENTS

Figure 1:
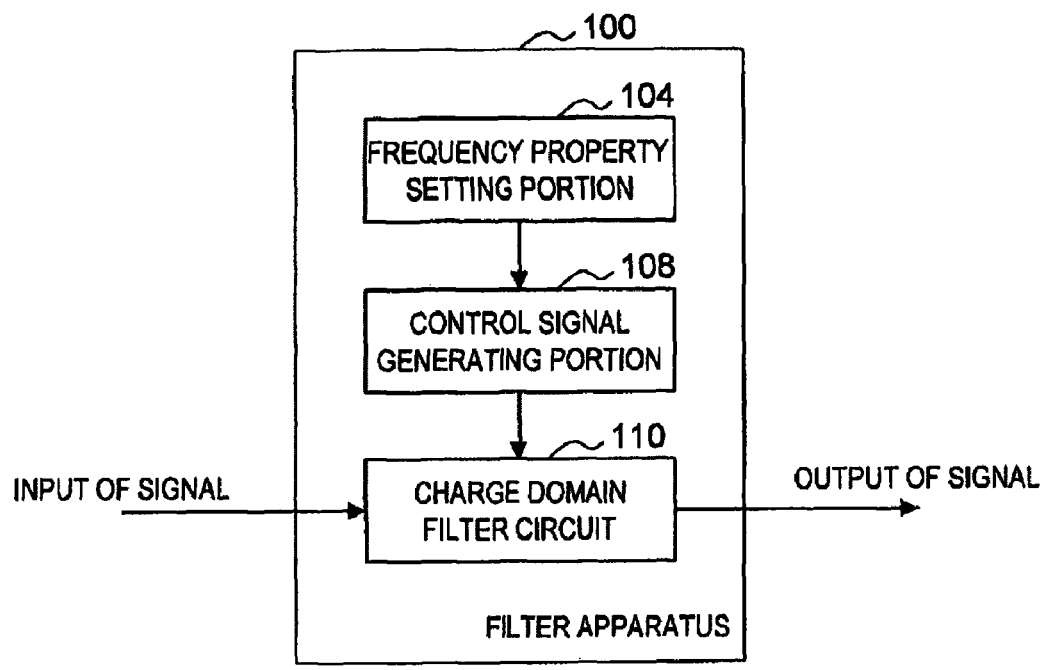
FIG. 1 is a diagram illustrating the configuration of a filter apparatus according to the present embodiment.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

The components of the "best mode for carrying out the invention" are described in the following order.

[1] Outline of filter apparatus according to present embodiment

[2] Objects of clock pulse generating circuit which relate to present embodiment

[3] Control signal generating portion that forms filter apparatus

[3-1] First example of configuration of transition time point changing portion

[3-2] Second example of configuration of transition time point changing portion

[3-3] Third example of configuration of transition time point changing portion

[4] Filtering method used in filter apparatus

[5] Conclusions

[1] Outline of Filter Apparatus According to Present Embodiment

First, the outline of the filter apparatus 100 according to the present embodiment is described with reference to FIGS. 1 to 4.

Figure 2:
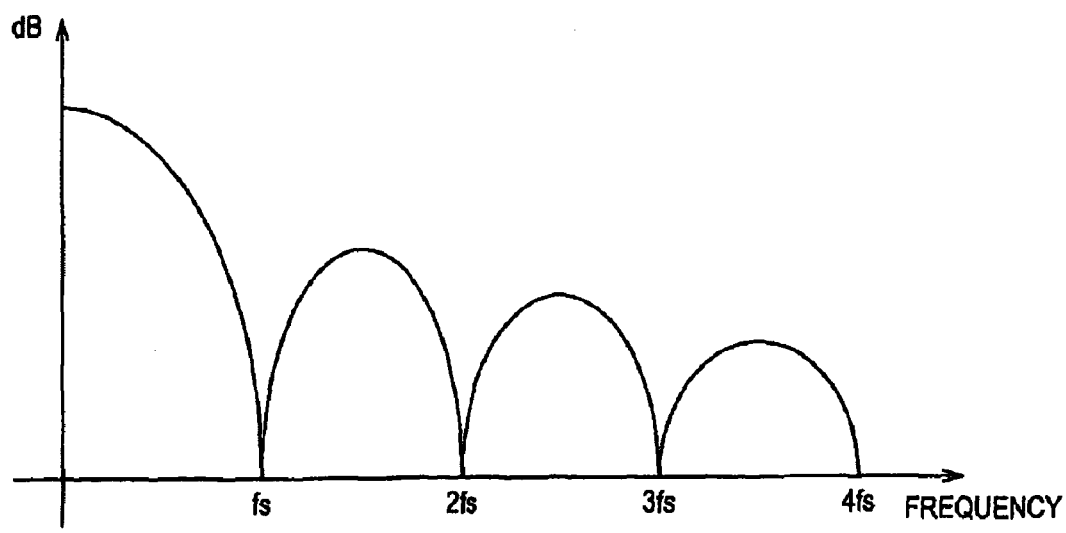
FIG. 2 is a graph illustrating the frequency properties of an output signal gained through the operation of the filter apparatus.
Figure 3:
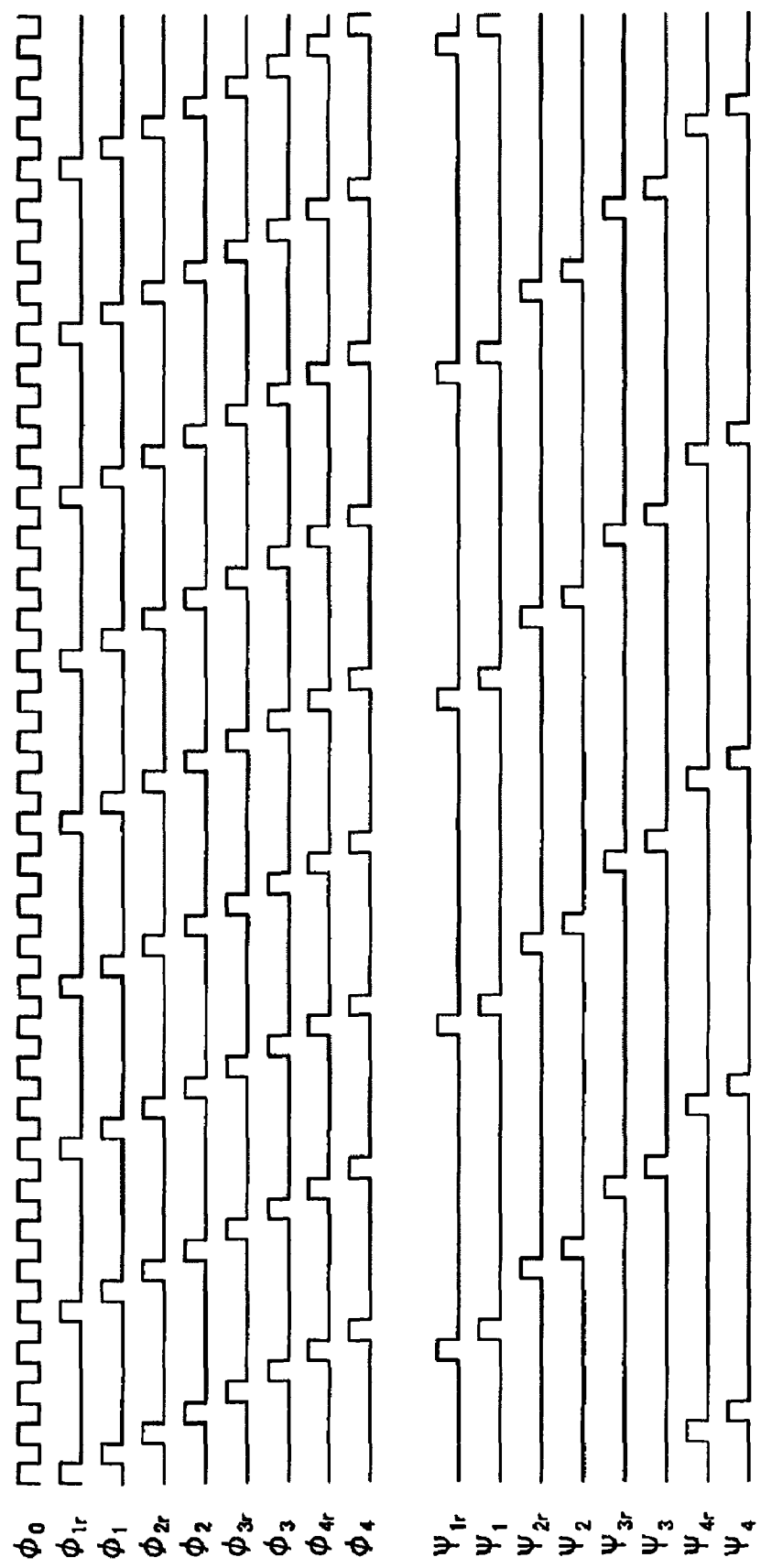
FIG. 3 is a graph illustrating control signals generated by the control signal generating portion.

FIG. 1 is a diagram illustrating the configuration of the filter apparatus 100 according to the present embodiment. FIG. 2 is a graph illustrating the frequency properties of an output signal gained through the operation of the filter apparatus 100. FIG. 3 is a graph illustrating control signals generated by the control signal generating portion 108.

As shown in FIG. 1, the filter apparatus 100 is provided with a frequency property setting portion 104, a control signal generating portion 108 and a charge domain filter circuit 110. The frequency property setting portion 104 sets the frequency properties of an output signal gained via the charge domain filter circuit 110 (see FIG. 2). The frequency property setting portion 104 may be provided with a user interface which is operated by the user so that they can gain desired frequency properties.

The control signal generating portion 108 generates control signals (pulse signals) for determining the frequency properties of the charge domain filter circuit 110 which are set by the frequency property setting portion 104, and outputs them to the charge domain filter circuit 110. Control signals included in the same signal set ($\phi 1r$ to $\phi 4$, control signal $\Psi 1r$ to control signal $\Psi 4$) have a predetermined phase difference and the same frequency, and periods when the signal level is H do not overlap, as shown in, for example, FIG. 3. In addition, the control signals function as mode switching signals for switching the circuit mode (circuit configuration) of the charge domain filter circuit 110.

The charge domain filter circuit 110 operates on the basis of the control signals shown in FIG. 3, which are generated by the control signal generating portion 108, and filters input signals. Signals outputted via the first filter circuit stage 120 described below that forms the charge-domain filter circuit 110 have the frequency properties shown in FIG. 2, for example.

As shown in FIG. 2, the frequency properties of signals which are outputted via the first filter circuit stage 120 described below are such that the frequency fs specified in accordance with the period of control signals generated by the control signal generating portion 108 and a frequency which is an integer times greater than the frequency fs are gained at points where signal level is zero, or null. Such frequency properties are similar to the SINC function in form, and therefore, circuits which can provide these frequency properties can be referred to as a SINC filter circuit. In addition, these frequency properties can be changed simply by changing the control signals generated by the control signal generating portion 108, and therefore, are advantageous, in that it is not necessary to provide a number of filter circuits in order to gain different frequency properties.

Next, the circuit configuration of the charge domain filter circuit 110 is described in detail with reference to FIG. 4.

Figure 4:
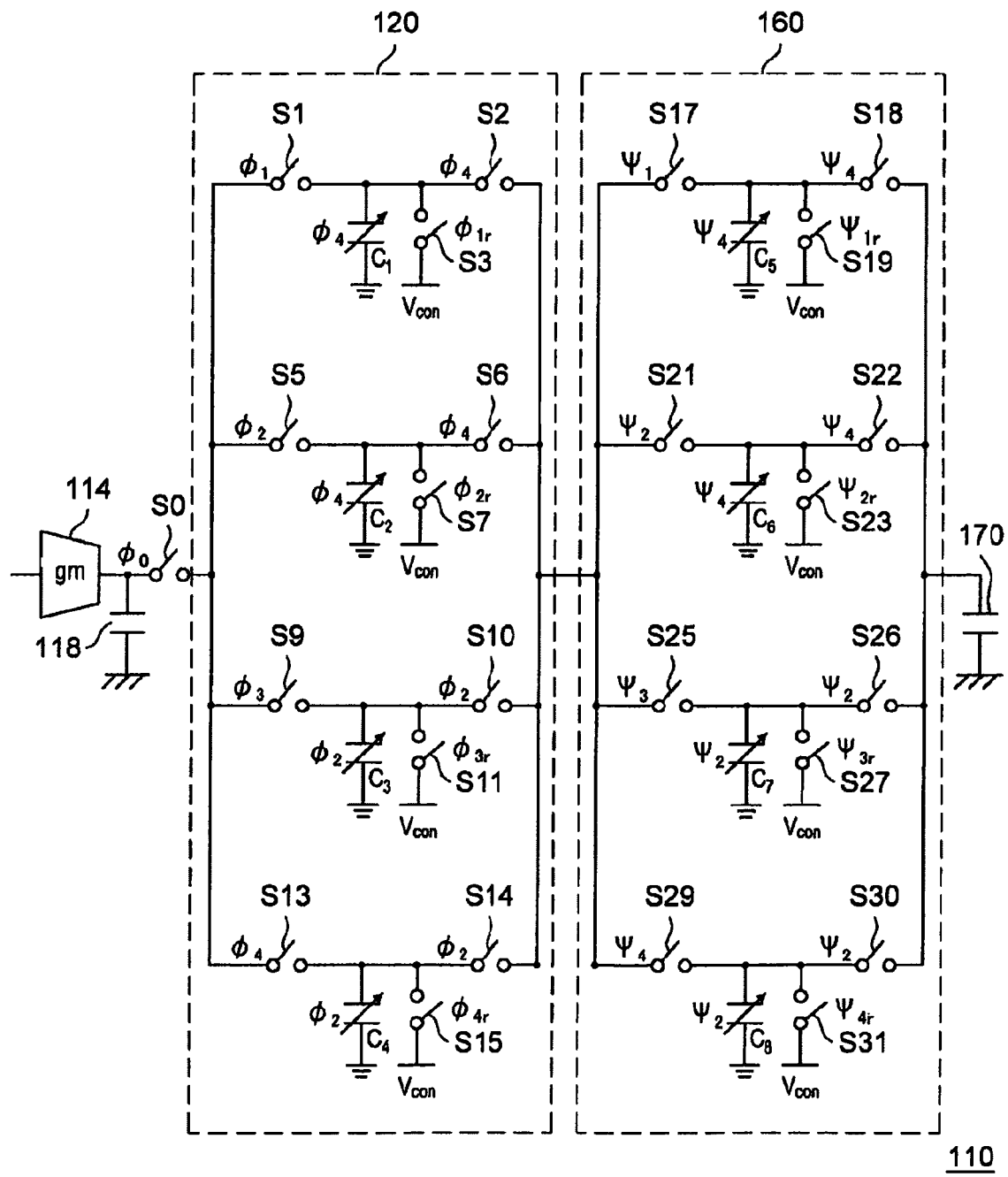
FIG. 4 is a diagram illustrating the circuit configuration of the charge domain filter circuit.

FIG. 4 is a diagram illustrating the circuit configuration of the charge domain filter circuit 110 according to the present embodiment. The charge domain filter circuit 110 is provided with a transconductor (gm) 114, an IIR capacitor 118, a first filter circuit stage 120, a second filter circuit stage 160 and an internal or external output capacitor 170. In addition, the control signals shown in FIG. 3 are inputted into the charge domain filter circuit 110. In addition, in the following, a case where the sampling speed of the first filter circuit stage 120 is decimated to ½ in the second filter circuit stage 160 is described as an example.

The transconductor 114 functions as a signal current outputting portion for converting the voltage of an inputted signal to a current which is proportional to the voltage, and outputs a current. The IIR capacitor 118 is connected to the transconductor 12 and functions in such a manner as to provide IIR properties to the charge domain filter circuit 110. Here, it is not essential to the present embodiment that IIR properties be provided to the charge domain filter circuit 110, and therefore, it is not necessary to provide the charge domain, filter circuit 110 with an IIR capacitor 118.

The first filter circuit stage 120 includes capacitors C1, C2, C3 and C4, and switches S1, S2, S3, S5, S6, S7, S9, S10, S11, S13, S14 and S15, which are switching portions.

The capacitors C1, C2, C3 and C4 have a function of storing a charge. In addition, the capacitors C1, C2, C3 and C4 according to the present embodiment may be varicaps (varactors) using a MOS of which the capacitance is variable or variable capacitance diodes. The MOS may operate in an inversion mode or in an accumulation mode.

In addition, in the present embodiment, $\phi 4$ shown beside the capacitor C1 indicates that the value of the capacitance of the capacitor C1 decreases while the control signal $\phi 4$, which is inputted into the charge domain filter circuit 110, is at the H level. φ2 and φ4 shown beside the capacitors C2, C3 and C4 are the same. That is to say, each capacitor C is provided with a control terminal to which a control signal of which the capacitance value decreases is inputted. In the case where the capacitor C is a MOS capacitor, the control terminal corresponds to, for example, a source or a drain.

The switch S1 is a switch for electrically connecting or disconnecting the capacitor C1 and the transconductor 114. φ1 shown beside the switch S1 indicates that the switch S1 is closed while the control signal φ1, which is inputted into the charge domain filter circuit 110, is at the H level, so that the capacitor C1 and the transconductor 114 are electrically connected. That is to say, φ1 functions as a mode switching signal for switching the circuit mode of at least a portion of the charge domain filter circuit 110. Control signals φ2 to φ4, control signals φ1r to φ4r, control signals Ψ1 to Ψ4 and control signals Ψ1r to Ψ4r function as mode switching signals in the same manner.

The switch S2 is a switch for electrically connecting or disconnecting the capacitor C1, the capacitor C2 and the capacitor C5 or C7 of the second filter circuit stage 160. φ4 shown beside the switch S2 indicates that the switch S2 is closed while the control signal φ4, which is inputted into the charge domain filter circuit 110, is at the H level, so that the capacitor C1, the capacitor C2 and the capacitor C5 or C7 of the second filter circuit stage 160 are electrically connected.

The switch S3 is a switch for electrically connecting or disconnecting the capacitor C1 and Vcom. φ1r shown beside the switch S3 indicates that the switch S3 is closed while the control signal φ1r, which is inputted into the charge domain circuit 110, is at the H level, so that the capacitor C1 and Vcom are electrically connected.

The switch S5 is a switch for electrically connecting or disconnecting the capacitor C2 and the transconductor 114 on the basis of the control signal φ2, as is the switch S1. In addition, the switch S9 is a switch for electrically connecting or disconnecting the capacitor C3 and the transconductor 114 on the basis of the control signal φ3. In addition, the switch S13 is a switch for electrically connecting or disconnecting the capacitor C4 and the transconductor 114 on the basis of the control signal φ4.

The switch S6 is a switch for electrically connecting or disconnecting the capacitor C1, the capacitor C2 and the capacitor C5 or C7 of the second filter circuit stage 160 on the basis of the control signal φ4, as is the switch S2. In addition, the switch S10 is a switch for electrically connecting or disconnecting the capacitor C3, the capacitor C4 and the capacitor C6 or C8 of the second filter circuit stage 160 on the basis of the control signal φ2. In addition, the switch S10 is a switch for electrically connecting or disconnecting the capacitor C3, the capacitor C4 and the capacitor C6 or C8 of the second filter circuit stage 160 on the basis of the control signal φ4.

The switch S7 is a switch for connecting or disconnecting the capacitor C2 and Vcom on the basis of the control signal φ2r, as is the switch S3. In addition, the switch S11 is a switch for connecting or disconnecting the capacitor C3 and Vcom on the basis of the control signal φ3r. In addition, the switch S15 is a switch for connecting or disconnecting the capacitor C4 and Vcom on the basis of the control signal φ4r.

The second filter circuit stage 160 includes capacitors C5, C6, C7 and C8, and switches S17, S18, S19, S21, S22, S23, S25, S26, S27, S29, S30 and S31.

The capacitors C5, C6, C7 and C8 have a function of storing a charge. In addition, the capacitors C5, C6, C7 and C8 according to the present embodiment may be varicaps (varactors) using a MOS which can make the capacitance C1, C2, C3 and C4 variable, or variable capacitance diodes. In addition, the value of the capacitance of the capacitors C5 and C6 is lowered during the period when the control signal Ψ4, which is inputted into the charge domain filter circuit 110, is at the H level, and the value of the capacitance of the capacitors C7 and C8 is lowered during the period when the control signal Ψ2, which is inputted into the charge domain filter circuit 110, is at the H level.

The switch S17 is a switch for electrically connecting or disconnecting the capacitors C1 and C2 of the first filter circuit stage 120 and the capacitor C5. Ψ1 shown beside the switch S17 indicates that the switch S17 is closed while the control signal Ψ1, which is inputted into the charge domain filter circuit 110, is at the H level, so that the capacitors C1 and C2 and the capacitor C5 are electrically connected.

The switch S18 is a switch for electrically connecting or disconnecting the capacitor C5, the capacitor C6 and the output capacitor 170. Ψ4 shown beside the switch S18 indicates that the switch S18 is closed while the control signal Ψ4, which is inputted into the charge domain filter circuit 110, is at the H level, so that the capacitors C5 and C6 and the output capacitor 170 are electrically connected.

The switch S19 is a switch for electrically connecting or disconnecting the capacitor C5 and Vcom. Ψ1r shown beside the switch S19 indicates that the switch S19 is closed while the control signal Ψ1r, which is inputted into the charge domain filter circuit 110, is at the H level, so that the capacitor C5 and Vcom are electrically connected.

The switch S21 is a switch for electrically connecting or disconnecting the capacitors C3 and C4 of the first filter circuit stage 120 and the capacitor C6 on the basis of the control signal Ψ2, as is the switch S17. In addition, the switch S25 is a switch for electrically connecting or disconnecting the capacitors C1 and C2 of the first filter circuit stage 120 and the capacitor C7 on the basis of the control signal Ψ3. In addition, the switch S29 is a switch for electrically connecting or disconnecting the capacitors C3 and C4 of the first filter circuit stage 120 and the capacitor C8 on the basis of the control signal Ψ4.

The switch S22 is a switch for electrically connecting or disconnecting the capacitor C5, the capacitor C6 and the output capacitor 170 on the basis of the control signal Ψ4, as is the switch S18. In addition, the switch S26 is a switch for electrically connecting or disconnecting the capacitor C7, the capacitor C8 and the output capacitor 170 on the basis of the control signal Ψ2. In addition, the switch S30 is a switch for electrically connecting or disconnecting the capacitor C7, the capacitor C8 and the output capacitor 170 on the basis of the control signal Ψ2.

The switch S23 is a switch for electrically connecting or disconnecting the capacitor C6 and Vcom on the basis of the control signal Ψ2r, as is the switch S19. In addition, the switch S27 is a switch for electrically connecting or disconnecting the capacitor C7 and Vcom on the basis of the control signal Ψ3r. In addition, the switch S31 is a switch for electrically connecting or disconnecting the capacitor C8 and Vcom on the basis of the control signal Ψ4r.

The output capacitor 170 has a capacitance for taking out the output from the charge domain filter circuit 110, for example. In addition, the output capacitor 170 may be an A/D converter. Here, in the case where a certain capacitor C is regarded as the first capacitor, the capacitor C included in the filter circuit stage in the rear stage of the filter circuit stage in which the capacitor C is included can be regarded as the second capacitor.

[2] Objects of Clock Pulse Generating Circuit which Relates to Present Embodiment As described above with reference to FIGS. 1 to 4, it is necessary for the control signals shown in FIG. 3 to be generated by the control signal generating portion 108 and supplied to the charge domain filter circuit 110 in order to operate the charge domain filter circuit 110. Therefore, an example of the clock pulse generating circuit which relates to the present embodiment and can generate the control signals shown in FIG. 3 is described below.

Figure 5:
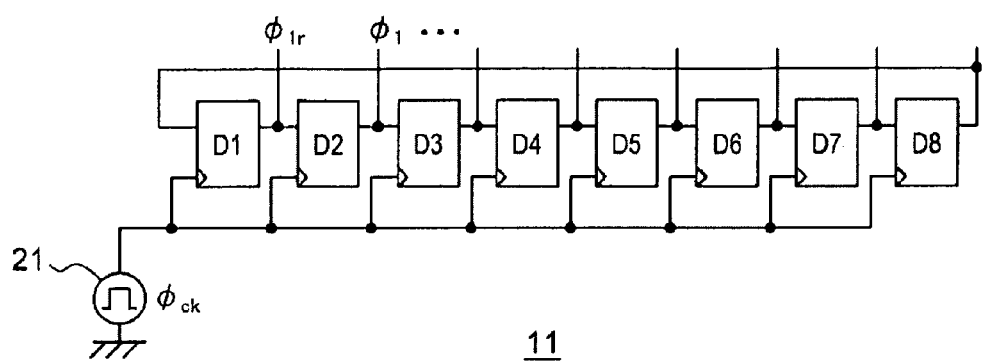
FIG. 5 is a diagram illustrating the configuration of a clock pulse generating circuit which relates to the present embodiment.

FIG. 5 is a diagram illustrating the configuration of a clock pulse generating circuit 11 which relates to the present embodiment. As shown in FIG. 5, the clock pulse generating circuit 11 is a circulating type shift register with an oscillating portion 21 and flip flops D1 to D8. The oscillating portion 21 generates a basic clock φck shown in the top level of FIG. 6 and supplies it to the respective flip flops D1 to D8.

Here, the data held by the respective flip flops D1 to D8 is to be sent to the flip flops D1 to D8 in the next level according to the timing when the basic clock φck rises. Accordingly, when the signal level of one flip flop D is set at H and the signal level of all the other flip flops D is set at L in this clock pulse generating circuit 11, the data H set in the one flip flop D is shifted to the flip flop D in the next stage following the basic clock φck, which is repeated in sequence so that the data H circulates within the clock pulse generating circuit 11.

Figure 6:
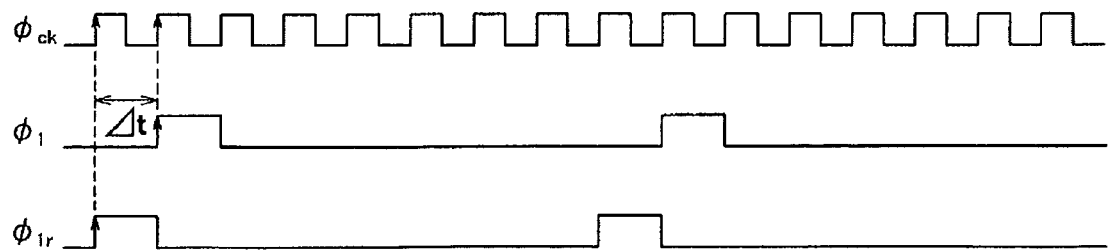
FIG. 6 is a graph illustrating clock pulses generated by the clock pulse generating circuit.

FIG. 6 shows the time chart of the signals outputted from the respective flip flops D1 to D8 at this time. Here, for the sake of clarifying the figure, FIG. 6 only shows the output signal φ1r outputted from the flip flop D1 and the output signal φ1 outputted from the flip flop D2 from among the signals outputted from the respective flip flops D1 to D8 and does not show the output signals outputted from the flip flops D3 to D8. As shown in FIG. 6, the output signals outputted from the flip flops D1 to D8 which are adjacent to each other are generated respectively with a phase shift corresponding to the period of the clock (Δt) of the basic clock φck and outputted respectively as the control signals φ1r, φ1, φ2r, φ2, φ3r, φ3, φ4r and φ4. As a result of use of the circulating type shift register makes it possible to easily generate the same control signals as in the top level FIG. 3 and thus makes it possible to generate control signals for operating the charge domain filter circuit 110.

Here, in the charge domain filter circuit 110, the control signal φ1, for example, is used to make the capacitor C sample an input signal and the control signal φ1r is used to reset the charge stored in the capacitor C.

Accordingly, it is possible for there to be no overlapping from the point of view of circuit properties during the period when the respective control signals including the control signals φ1r and φ1 are maintained at H. With respect to this point, dropping from H to L of each control signal generated by the clock pulse generating circuit 11 in some cases overlaps the rising of the next control signal from L to H. Thus FIG. 7 shows the circuit configuration of a clock pulse generating circuit 12 where timing of the rising and dropping of the respective control signals do not overlap, and FIG. 8 shows the clock pulses generated by the clock pulse generating circuit 12.

Figure 7:
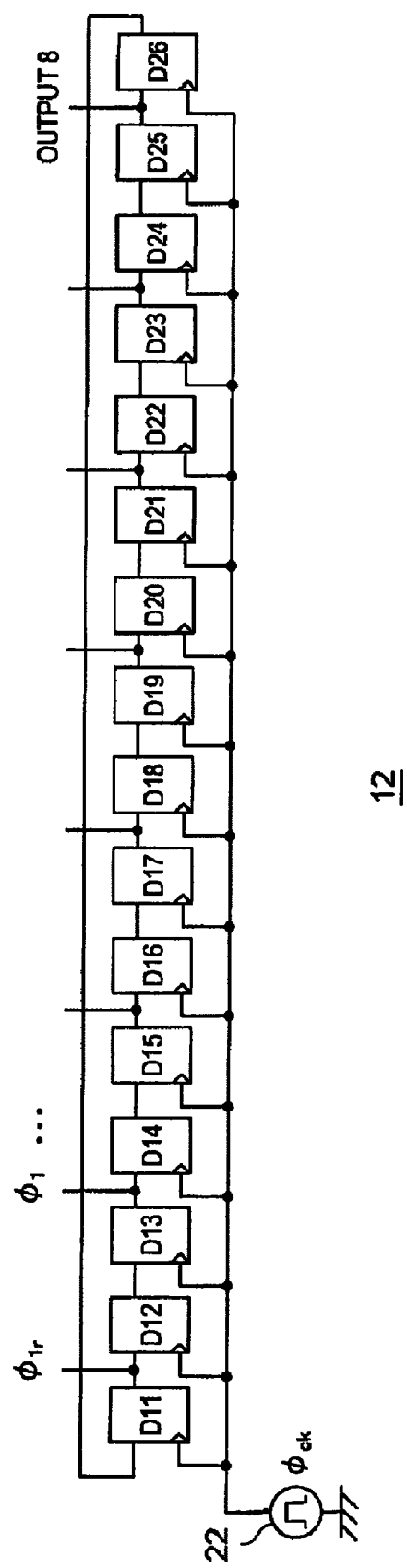
FIG. 7 is a diagram illustrating the configuration of another clock pulse generating circuit which relates to the present embodiment.

As shown in FIG. 7, the clock pulse generating circuit 12 is a circulating type shift register with an oscillating portion 22 and flip flops D11 to D26. The oscillating portion 22 generates a basic clock φck as shown in the top level of FIG. 8 and supplies the basic clock φck to the respective flip flops D11 to D26.

In addition, in the same manner as in the clock pulse generating circuit 11, a case where the signal level of one flip flop D is set at H as the initial value in the clock pulse generating circuit 12 and all the other flip flops D are set at L is assumed. Here, the data held by the respective flip flops D11 to D26 is sent to the flip flops D11 to D26 in the next stage according to the timing when the basic clock φck rises in the same manner as in the clock pulse generating circuit 11. Accordingly, in the case where the signal level of one flip flop D is set at H as the initial value as described above, the data H circulates in the clock pulse generating circuit 12.

Figure 8:
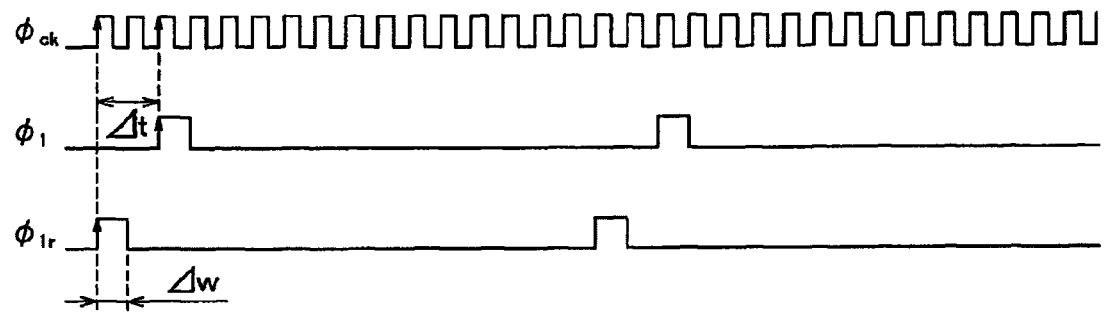
FIG. 8 is a graph illustrating clock pulses generated by the clock pulse generating circuit.

Therefore, in the case where every other output from the flip flops D11 to D26 is sampled, control signals φ1, φ1r and the like where the periods when the respective signals are at H do not overlap can be gained as shown in the middle and bottom levels of FIG. 8. Here, the control signal φ1 has a phase delay which corresponds to two periods (Δt) of the basic clock φck relative to the control signal φ1r. In addition, the time when the respective control signals are at H is the time which corresponds to one period (Δw) of the basic clock φck.

Here, it is necessary for the clock pulse generating circuit 12 to be provided with a flip flop D of which the number of stages is two times greater than that in the clock pulse generating circuit 11. In addition, it is necessary for the oscillating portion 22 to generate a basic clock of which the frequency is two times greater than that of the oscillating portion 21. Here, periods when the signal levels of the respective control signals are at H can be prevented from overlapping also by providing a circuit for adjusting the phase of the control signals generated by the clock pulse generating circuit 11.

Incidentally, the charge domain filter circuit 110 has frequency properties in accordance with the time intervals Δt between the respective control signals shown in FIG. 6 or 8. Concretely, in the charge domain filter circuit 110, the frequency fs of the initial attenuation pole (notch) shown in FIG. 2 becomes 1/Δt Hz which is an inverse of the time intervals Δt of the respective control signals.

Accordingly, it becomes possible to increase the original notch frequency 1/Δt in the charge domain filter circuit 110 by increasing the frequency of the basic clock φck generated by the oscillating portion 21 or the oscillating portion 22. In this manner, the frequency properties of the charge domain filter circuit 110 can be adjusted by the frequency of the basic clock φck in the clock pulse generating circuit 11 or 12.

In addition, it is necessary for the clock pulse generating circuit 11 or 12 to operate at a higher frequency in order to implement a charge domain filter circuit 110 which can deal with signals in a wider band. In the case where the initial notch frequency is set at 4 GHz in order to secure a pass band having a magnitude in GHz, for example, it is necessary for the time intervals Δt between the respective control signals to be 250 ps. That is to say, it is necessary for the oscillating portion 21 to generate a basic clock φck of 4 GHz in the clock pulse generating circuit 11 shown in FIG. 5 and for the oscillating portion 22 to generate a basic clock φck of 8 GHz in the clock pulse generating circuit 12 shown in FIG. 7.

Furthermore, in the case where a decimation is carried out between the respective stages in the charge domain filter circuit 110 having a number of filter circuit stages shown in FIG. 4, it is necessary to operate the clock pulse generating circuit 11 or 12 which generates control signals supplied to the front stage at a higher frequency.

In the charge domain filter circuit 110 where filter circuit stages are cascade connected in two stages, for example, a case where a decimation of ½ is carried out between the respective stages is assumed. In addition, the original notch frequency is set at 4 GHz, as for the frequency properties of the entirety of the charge domain filter circuit 110. In this case, it is necessary for control signals generated by the clock pulse generating circuit 11 which operates at 4 GHz or control signals generated by the clock pulse generating circuit 12 which operates at 8 GHz to be supplied to the filter circuit stage in the rear of the charge domain filter circuit 110. In addition, in the case where the decimation ratio between the first and second stages is ½, it is necessary to supply control signals generated by the clock pulse generating circuit 11 or 12 which operates at 8 GHz or 16 GHz to the filter circuit stage in the front of the charge domain filter circuit 110.

As described above, in the clock pulse generating circuit 11 or 12 which relates to the present embodiment, it is necessary to operate a shift register (a number of flip flops) at an extremely high frequency in order to make the charge domain filter circuit 110 deal with signals of a magnitude in GHz. In addition, in the case where control signals in such a high frequency are generated, power consumption increases in the oscillating portion 21 or 22 and the circuit groups which belong to the oscillating portion 21 or 22.

Thus, in view of the above described state, the creation of the filter apparatus 100 according to the present embodiment is achieved. The control signal generating portion 108 which forms the filter apparatus 100 according to the present embodiment can generate control signals for operating the charge domain filter circuit 110 while keeping the power consumption low. In the following, the control signal generating portion 108 which forms the filter apparatus 100 and its operation are described in detail with reference to FIGS. 9 to 18.

[3] Control Signal Generating Portion that Forms Filter Apparatus

Figure 9:
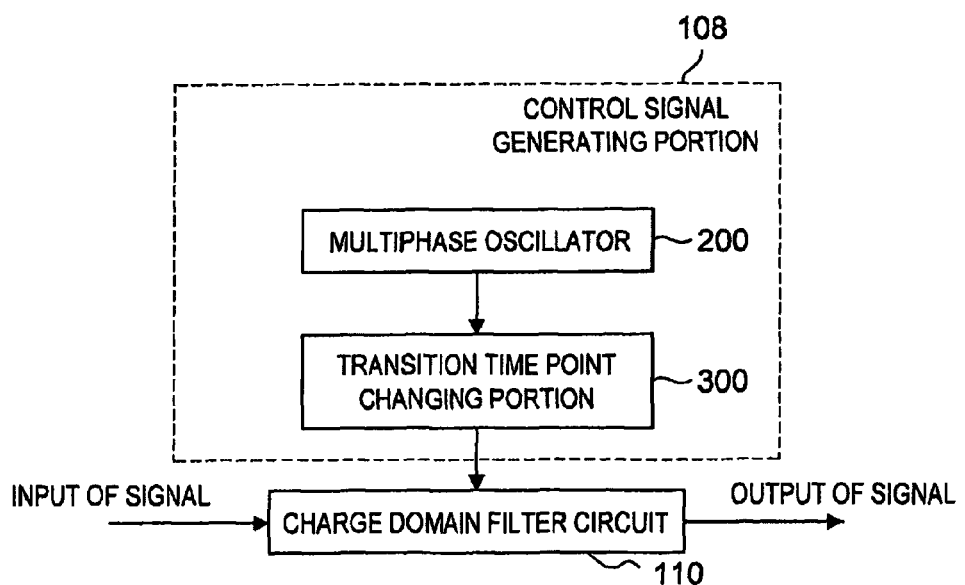
FIG. 9 is a is a function block diagram showing an example of the configuration of the control signal generating portion.

FIG. 9 is the functional block diagram showing an example of the configuration of a control signal generating portion 108. As shown in FIG. 9, the control signal generating portion 108 is provided with a multiphase oscillator 200 and a transition time point changing portion 300 and functions as a signal generating apparatus.

The multiphase oscillator 200 generates a number of base signals of which the signal level transitions between H (first level or second level) and L (second level or first level), and which have the same frequency and a predetermined phase difference between them. In addition, the multiphase oscillator 200 generates a number of base signals where periods when the signal level of any given base signal is H and the signal level of the next base signal having a predetermined phase delay relative to the given base signal is H overlap. An example of the multiphase oscillator 200 is described below with reference to FIGS. 10 and 11.

Figure 10:
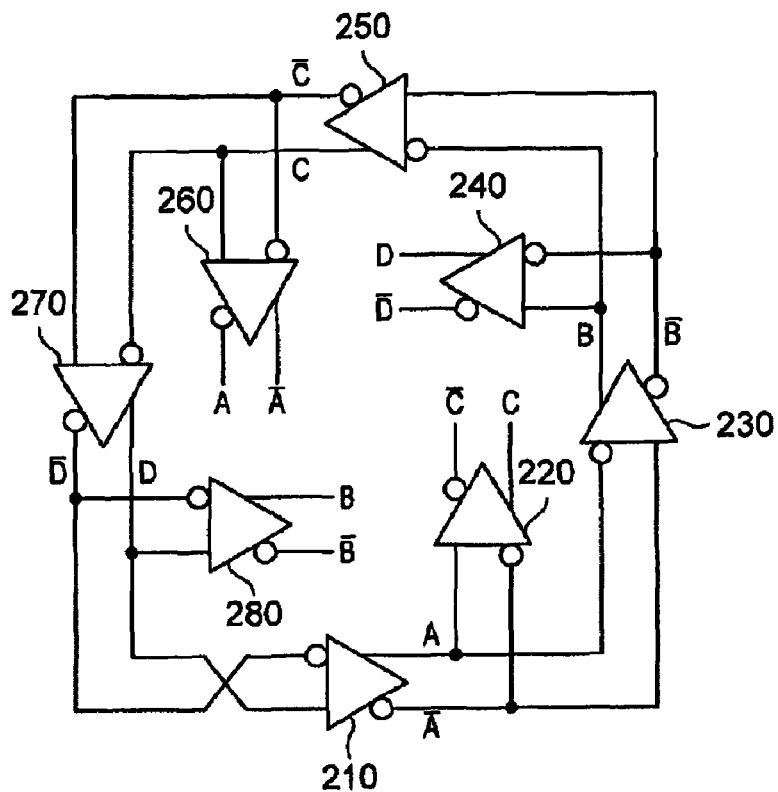
FIG. 10 is a diagram illustrating an example of the configuration of the multiphase oscillator.
Figure 11:
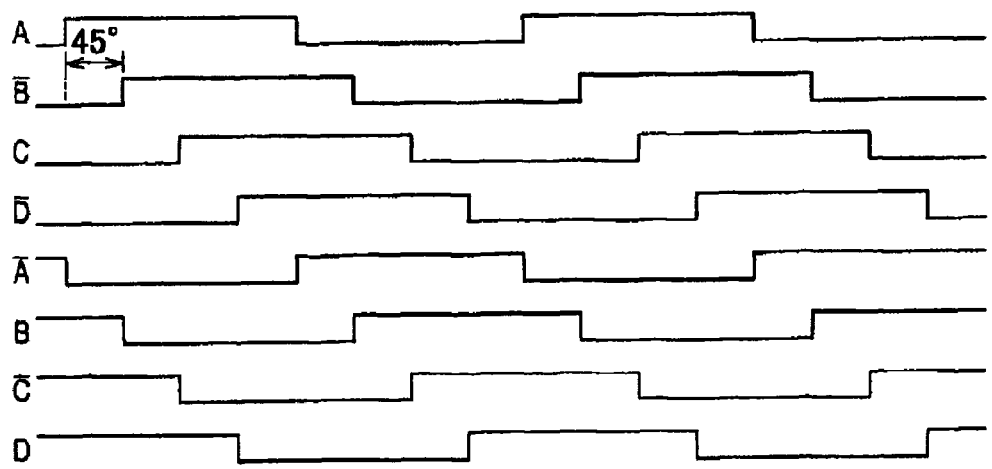
FIG. 11 is a graph illustrating base signals generated by the multiphase oscillator.

FIG. 10 is a diagram illustrating the configuration of an example of a multiphase oscillator 200. FIG. 11 is a diagram illustrating base signals generated by the multiphase oscillator 200. As shown in FIG. 10, the multiphase oscillator 200 is a ring oscillator having a number of delay inverting elements 210 to 280 which delay and invert input signals.

Though the example shown in FIG. 10 illustrates a case where a number of signals are inputted into and a number of signals are outputted from each delay inverting element 210 to 280, one delay inverting element may be provided for the input and output of one signal. In addition, the respective delay inverting elements 210 to 280 may be formed in a CMOS process or may operate on the basis of the differential between a number of inputted signals.

As shown in FIG. 11, base signals in eight phases having a phase difference of 45 degrees are gained from this multiphase oscillator 200. In the case where the frequency of the respective base signals is 500 MHz, for example, the differential between two adjacent base signals at the time of rising is 250 ps. Here, the frequency of the respective base signals can be changed by adjusting the amount of delay in the respective delay inverting elements 210 to 280, for example.

However, the periods where the respective signal levels of these base signals are H overlap, and therefore, it is difficult to use the base signals as control signals supplied to the respective filter circuit stages in the charge domain filter circuit 110. Therefore, a transition time point changing portion 300 which adjusts the timing with which the respective base signals generated by the multiphase oscillator 200 drop and makes it possible to generate control signals is proposed. In the following, a concrete example of the configuration of such a transition time point changing portion 300 is given.

[3-1] First Example of Configuration of Transition Time Point Changing Portion

Figure 12:
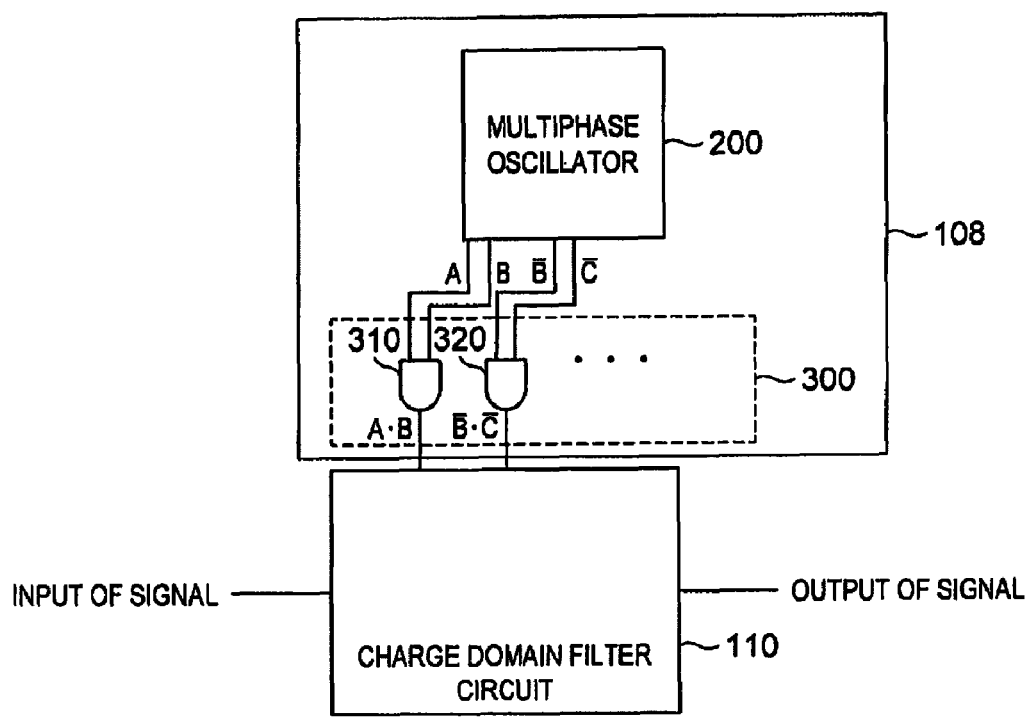
FIG. 12 is a diagram illustrating a first example of the configuration of the transition time point changing portion.

FIG. 12 is a diagram illustrating a first example of the configuration of the transition time point changing portion 300. As shown in FIG. 12, the transition time point changing portion 300 is provided with a number of logic operating portions 310 and 320 for operating the logical product of two base signals.

A base signal A and a base signal B which is an inverted signal of a base signal /B having the predetermined phase difference relative to the base signal A, for example, are inputted into the logic operating portion 310 and the logical product of the base signal A and the base signal B is operated.

In addition, the base signal /B and a base signal /C which is an inverted signal of a base signal C having the predetermined phase difference relative to the base signal /B are inputted into the logic operating portion 320 which operates the logical product of the base signal /B and the base signal /C. Though not shown in FIG. 12, the transition time point changing potion 300 is provided with a logic operating portion for carrying out a logic operation on the respective base signals C, /D, /A, B, /C and D generated by the multiphase oscillator 200 in the same manner.

Figure 13:
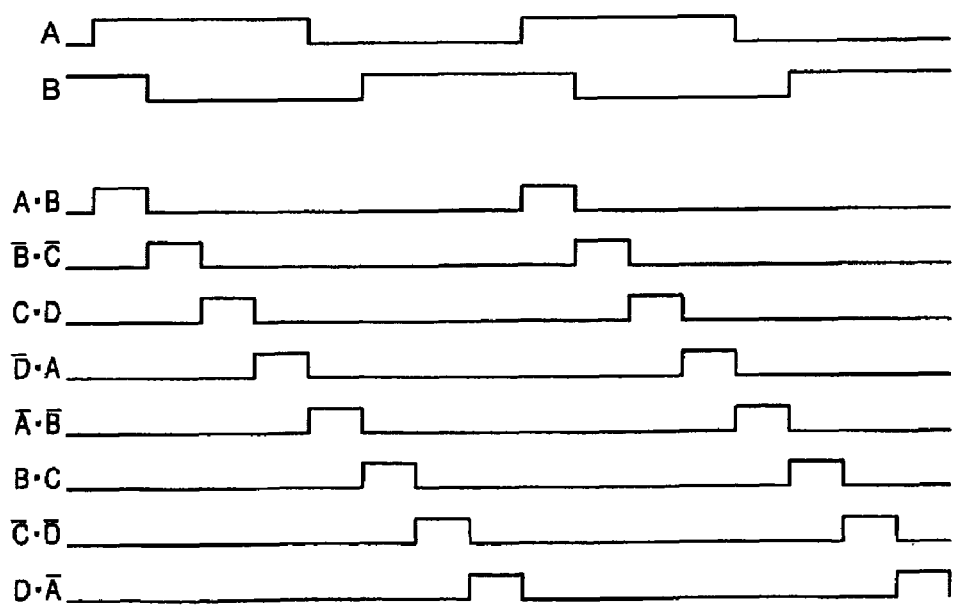
FIG. 13 is a graph illustrating the manner in which control signals are generated by the transition time point changing portion shown in FIG. 12.

FIG. 13 is a graph illustrating the manner in which control signals are generated by the transition time point changing portion 300 shown in FIG. 12. As shown in FIG. 13, the transition time point changing portion 300 shown in FIG. 12 can generate a number of control signals, each of which has a predetermined phase difference, and where the periods when the signal level is H do not overlap on the basis of base signals generated by the multiphase oscillator 200. Here, A·B shown in FIG. 13 may correspond to $\phi 1r$, /B·/D may correspond to $\phi 1$, and C·D may correspond to $\phi 2r$.

Here, the frequency properties of the charge domain filter circuit 110 greatly depends on the time intervals Δt (intervals between time of rising) of the respective control signals, as described above, and therefore, high precision is required in the time intervals Δt of the respective control signals. Meanwhile, the pulse width Δw of the respective control signals is a parameter which corresponds to a window section for transferring a signal between the respective filter circuit stages. Accordingly, the level of precision is not necessarily important, as long as the time required for a sequence of transition responses in the conveyance of a charge between stages where a switch is closed, a current flows via the switch and sharing of a charge between capacitors C in the next stage is completed is secured.

[3-2] Second Example of Configuration of Transition Time Point Changing Portion

In the first example of the configuration of the transition time point changing portion 300, periods when a certain control signal and the next control signal are kept at the H level do not overlap while the transition time points when a certain control signal drops and the next control signal rises coincide. When control signals where the transition time points coincide in this manner are supplied to the charge, domain filter circuit 110, for example, there is a risk that resetting may be simultaneously carried out for a period of time after sampling by the capacitor C is started. Though such a state can, of course, be prevented, depending on the circuit design, it is also effective to prevent the timing with which respective control signals rise and drop from coinciding. Therefore, the second example of the configuration of the transition time point changing portion 300, which is characterized in that a control signal drops before the next control signal rises, is described below.

Figure 14:
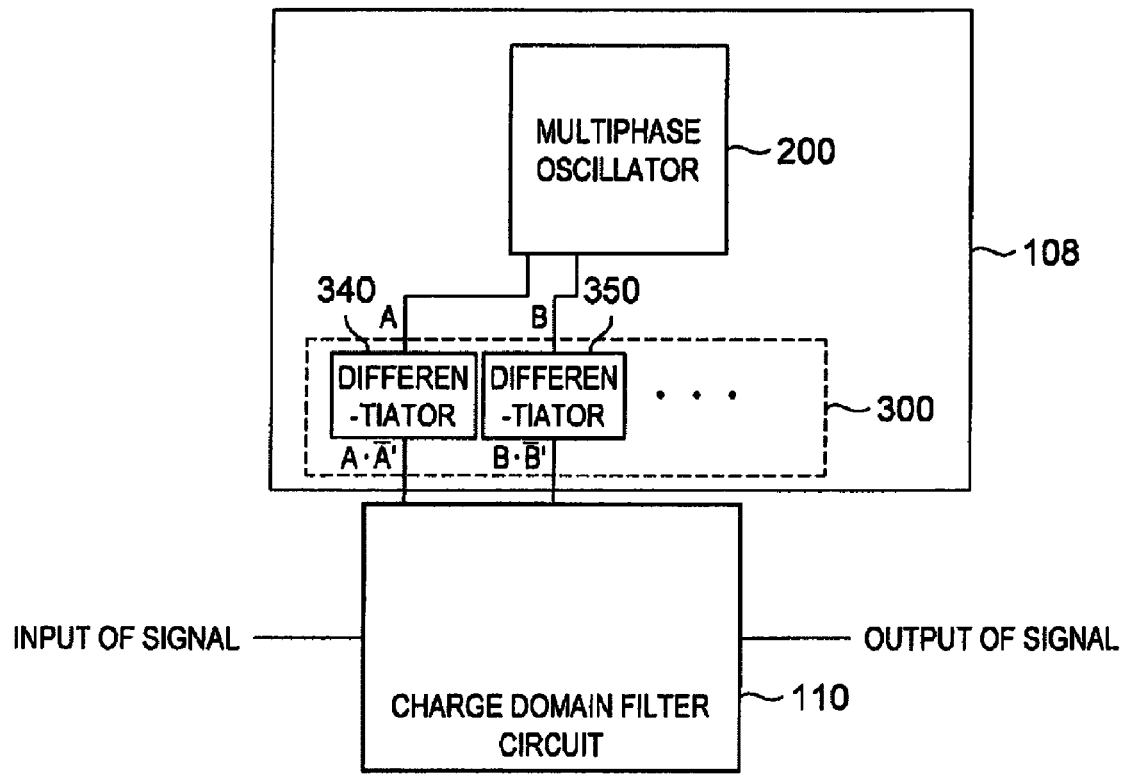
FIG. 14 is a diagram illustrating a second example of the configuration of the transition time point changing portion.

FIG. 14 is a diagram showing the second example of the configuration of the transition time point changing portion 300. As shown in FIG. 14, the transition time point changing portion 300 is provided with a number of differentiators 340 and 350 which detect rising of one base signal.

Figure 15:
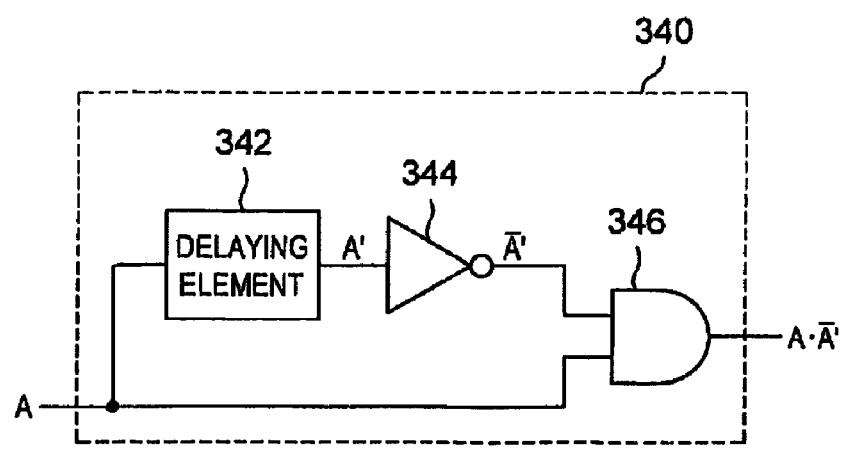
FIG. 15 is a diagram illustrating the configuration of a differentiator in detail.
Figure 16:
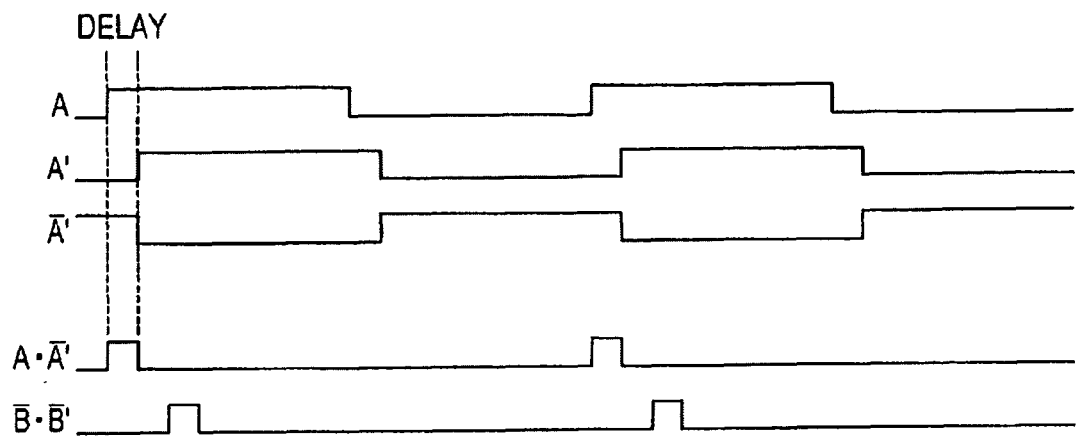
FIG. 16 is a diagram illustrating the manner in which control signals are generated by the transition time point changing portion shown in FIG. 14.

FIG. 15 is a diagram illustrating the configuration of the differentiator 340 in detail. FIG. 16 is a graph illustrating the manner in which control signals are generated by the transition time point changing portion 300, as shown in FIG. 14. As shown in FIG. 15, the differentiator 340 is provided with a delay element 342, an inverter 344 and a logic operating portion 346.

The delay element 342 delays the phase of the inputted base signal A by a phase which is the predetermined phase difference or less, and outputs the base signal A to the inverter 344 as the base signal A' shown in the second stage in FIG. 16. This delay element 342 may be, for example, an even number of MOS inverter columns, capacitors or resistors.

The inverter 344 inverts the base signal A' outputted from the delay element 342 and outputs the resulting signal to the logic operating portion 346 as the base signal /A' shown in the third stage in FIG. 16. Here, as for the order in the alignment of the delay element 342 and the inverter 344, the delay element 342 may be first, or the inverter 344 may be first. In addition, in the case where the necessary amount of delay is not greatly different from the amount of delay in the phase in the inverter 344, the delay element 342 may not be provided.

The logic operating portion 346 operates the logical product of the base signal A and the base signal /A' outputted from the inverter 344 and outputs A·/A' shown in the fourth stage in FIG. 16 as a control signal. The pulse width of this control signal corresponds to the amount of delay in the phase caused by the delay element 342.

Though not shown in FIG. 14, the transition time point changing portion 300 is provided with a number of differentiators for carrying out the same process on base signals C, /D, /A, B, /C and D. As a result, this transition time point changing portion 300 can generate a number of control signals where periods during which the signal level is H do not overlap and the timing with which the signal level transitions does not coincide on the basis of the base signals generated by the multiphase oscillator 200. In addition, it is possible to easily change the pulse width of the respective control signals by adjusting the amount of delay in the phase using the delay element 342.

[3-3] Third Example of Configuration of Transition Time Point Changing Portion

Figure 17:
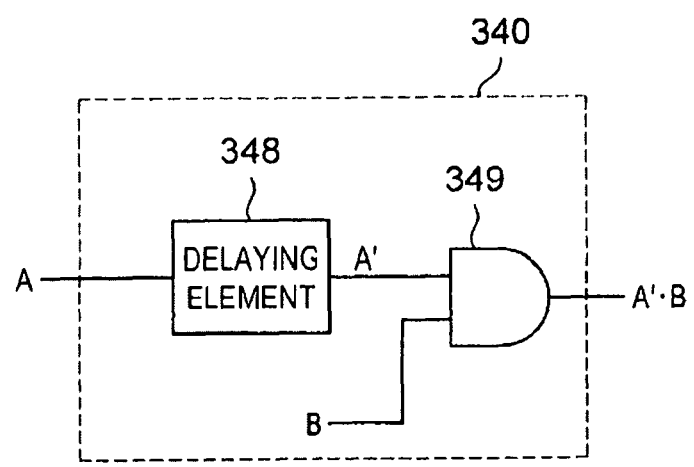
FIG. 17 is a diagram illustrating a third example of the configuration of the transition time point changing portion.

FIG. 17 is a diagram illustrating the third example of the configuration of the transition time point changing portion 300. Though the transition time point changing portion 300 in the third example is provided with a number of differentiators 340 and 350, as in the third example, the configuration of the respective differentiators 340 and 350 is different.

Concretely, the differentiator 340 in the transition time point changing portion 300 in the third example is provided with a delay element 348 and a logic operating portion 349. When a base signal A is inputted into the delay element 348, the phase of the base signal A is delayed and outputted to the logic operating portion 349 as a base signal A'.

The logic operating portion 349 outputs the logical product of the base signal A' and a base signal B which is an inverted signal of the base signal /B which has the predetermined phase difference relative to the base signal A as an operator or a control signal. The transition time point changing portion 300 in the third example of the configuration is provided with a number of differentiators for generating control signals on the basis of a number of base signals, as in the above.

[4] Filtering Method Used in Filter Apparatus

In the above, the configuration of the filter apparatus 100 according to the present embodiment is described. Next, the filtering method used in this filter apparatus 100 is described with reference to FIG. 18.

Figure 18:
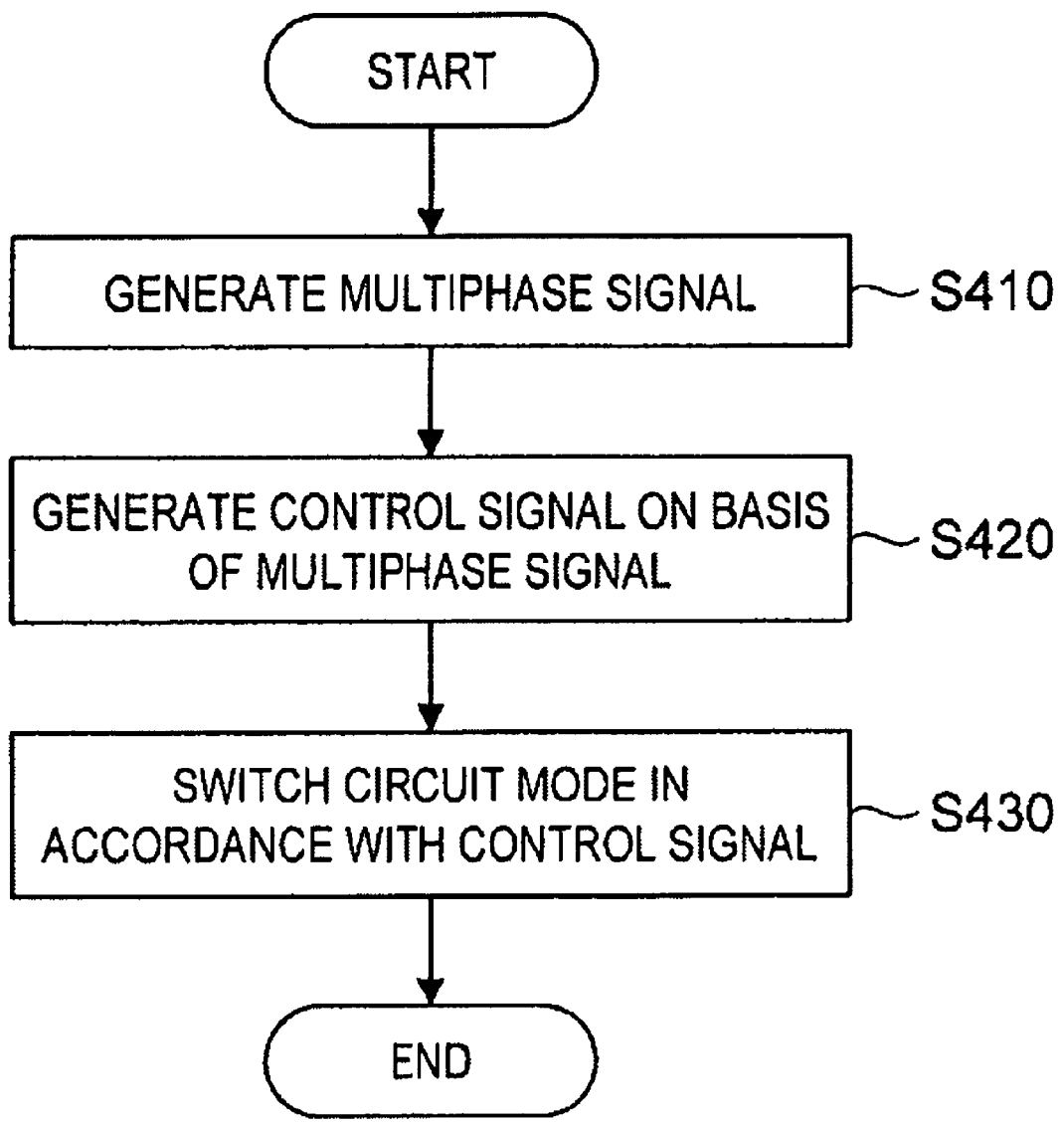
FIG. 18 is a flow chart showing the flow of a filtering method used in the filter apparatus according to the present embodiment.

FIG. 18 is a flow chart showing the flow in the filtering method used in the filter apparatus 100 according to the present embodiment. As shown in FIG. 18, the multiphase oscillator 200 in the control signal generating portion 108 generates the multiphase signal shown in FIG. 11 (S410). Subsequently, the transition time point changing portion 300 in the control signal generating portion 108 generates the control signals shown in FIG. 13 on the basis of the multiphase signal generated by the multiphase oscillator 200, for example (S420). The control signals generated by this one control signal generating portion 108 are supplied to one filter circuit stage in the charge domain filter circuit 110.

Then, the switching portion in the charge domain filter circuit 110 switches the circuit mode on the basis of the supplied control signal. Here, the circuit modes include a sampling mode in which one capacitor C samples input signals and an output mode in which the capacitor C outputs the charge stored when sampled. S1, 5, 9 and 13 are turned on in sequence on the basis of control signals φ1, φ2, φ3 and φ4, which are respectively supplied, and sampling is carried out in the order: capacitor C1, capacitor C2, capacitor C3, capacitor C4 (S430).

[5] Conclusions

As described above, in the filter apparatus 100 according to the present embodiment, the control signal generating portion 108 can generate a number of control signals where periods during which the signal level is H do not overlap without using a shift register which operates at, high speed. As a result, it becomes possible to operate the charge domain filter circuit 110 while keeping the power consumption low. This filter apparatus 100 is particularly effective in the case where a charge domain filter circuit 110 is formed in a CMOS process.

It should be understood by those skilled in the art that various modifications, combinations, sub-combinations and alterations may occur depending on design requirements and other factors insofar as they are within the scope of the appended claims or the equivalents thereof.

For example, in the respective steps in the process in the filter apparatus 100 in the present specification, it is not necessary for the process to be carried out in a time series in the order shown in the flow chart, and processes carried out in parallel or individually (for example, a parallel process or a process using objects) may be included.

What is claimed is:

1. A signal generating apparatus comprising:
   a multiphase oscillating portion for generating a plurality of base signals having a same frequency and a predetermined phase difference, which are a plurality of base signals where periods during which (1) any given base signal and (2) an intermediate next base signal having the predetermined phase delay relative to the given base signal are both kept at a first level overlap; and
   a transition time point changing portion for generating, from each base signal of the plurality of signals, a corresponding pulse signal by changing a first time point, at which the base signal transitions from the first level to a second level, to a second time point before the next base signal transitions from the second level to the first level, so that periods during which the pulse signal generated from a given base signal and the pulse signal generated from the intermediate next base signal are kept at the first level do not overlap.

2. The signal generating apparatus according to claim 1, wherein the transition time point changing portion comprises a logic unit for generating one pulse signal by operating a logical product of a first base signal generated by the multiphase signal generating portion and an inverted signal of the base signal having the given phase difference relative to the first base signal.

3. The signal generating apparatus according to claim 1, wherein the transition time point changing portion comprises:
   a delaying portion for generating a signal by inverting the signal level of a first base signal generated by the multiphase signal generating portion and delaying the phase by the predetermined phase difference or less; and
   a logic unit for generating one pulse signal by operating a logical product of the first base signal and a signal generated by the delaying portion.

4. A filter apparatus where input signals are sampled by different first capacitors in sequence, and at least a portion of the charge stored in the first capacitors when sampled is outputted, comprising:
   a multiphase oscillating portion for generating a number of base signals having a same frequency and a predetermined phase difference, where periods during which (1) any given base signal and (2) a next base signal having the phase delay relative to the given base signal are both kept at a first level overlap;
   a transition time point changing portion for generating a pulse signal by changing a first time point when each of the base signals transitions from the first level to a second level to a second time point when or before the next base signal transitions from the second level to the first level; and
   a switching portion for allowing each of the first capacitors to sample the input signal in sequence on the basis of the number of pulse signals.

5. The filter apparatus according to claim 4, wherein the transition time point changing portion comprises a logic unit for generating one pulse signal by operating a logical product of a first base signal generated by the multiphase signal generating portion and an inverted signal of the base signal having the predetermined phase difference with the first base signal.

6. The filter apparatus according to claim 4, wherein the transition time point changing portion comprises:
   a delaying portion for generating a signal by inverting the signal level of a first base signal generated by the multiphase signal generating portion and delaying the phase by the predetermined phase difference or less; and
   a logic unit for generating one pulse signal by operating a logical product of the first base signal and a signal generated by the delaying portion.

7. The filter apparatus according to claim 4, wherein the first capacitors comprise a control terminal into which a pulse signal for lowering the capacitance of the first capacitors is inputted.

8. A signal generating method, comprising the steps of:
   generating a plurality of base signals having a same frequency and a predetermined phase difference where periods during which (1) any given base signal and (2) an intermediate next base signal having the predetermined phase delay relative to the given base signal are both kept at a first level overlap; and
   generating, from each base signal of the plurality of base signals, a corresponding pulse signal by changing a first time point, at which the base signal transitions from the first level to a second level, to a second time point before the next base signal transitions from the second level to the first level, so that the periods during which the pulse signal generated from a given base signal and the pulse signal generated from the intermediate next base signal are kept at the first level do not overlap.

9. A filtering method which is implemented in a filter apparatus where input signals are sampled by different first capacitors in sequence and at least a portion of the charge stored in the first capacitors when sampled is outputted, comprising the steps of:
   generating a number of base signals having a same frequency and a predetermined phase difference where periods during which (1) any given base signal and (2) a next base signal having the predetermined phase delay relative to the given base signal are both kept at a first level overlap;
   generating a pulse signal by changing a first time point when each of the base signals transitions from the first level to a second level to a second time point before the next base signal transitions from the second level to the first level; and
   making each of the first capacitors sample input signals in sequence on the basis of the pulse signals.

* * * * *